United States Patent [19]

Hong

[11] Patent Number: 5,489,543
[45] Date of Patent: Feb. 6, 1996

[54] METHOD OF FORMING A MOS DEVICE HAVING A LOCALIZED ANTI-PUNCHTHROUGH REGION

[75] Inventor: Gary Hong, Hsin-Chu, Taiwan

[73] Assignee: United Microelectronics Corp., Hsinchu, Taiwan

[21] Appl. No.: 347,880

[22] Filed: Dec. 1, 1994

[51] Int. Cl.⁶ .............................................. H01L 21/8234
[52] U.S. Cl. ................................ 437/41; 437/26; 437/29; 437/40; 437/44
[58] Field of Search .......................... 437/41 R, 41 RLD, 437/41 SW, 40 R, 40 RG, 29, 913, 26, 44

[56] References Cited

U.S. PATENT DOCUMENTS

| | | | |
|---|---|---|---|
| 4,011,105 | 3/1977 | Paivinen et al. | 437/41 RG |
| 5,270,234 | 12/1993 | Huang et al. | 437/44 |
| 5,399,508 | 3/1995 | Nowak | 437/29 |
| 5,413,949 | 5/1995 | Hong | 437/44 |
| 5,429,956 | 7/1995 | Shell et al. | 437/29 |
| 5,434,093 | 7/1995 | Chau et al. | 437/40 RG |

Primary Examiner—Brian E. Hearn
Assistant Examiner—Michael Trinh
Attorney, Agent, or Firm—Ladas & Parry

[57] ABSTRACT

A method of forming a MOS device having a localized anti-punchthrough region, which is adjacent to but is not in contact with source/drain regions of the MOS device. A trench is formed by depositing a conducting layer on an oxide layer located on a channel region of the MOS device. The trench is used as a self-alignment mask for a subsequent implantation process to form the localized anti-punchthrough region.

13 Claims, 5 Drawing Sheets

METHOD OF FORMING A MOS DEVICE HAVING A LOCALIZED ANTI-PUNCHTHROUGH REGION

BACKGROUND OF THE INVENTION

1. Field of the Invention

The present invention relates generally to a method of forming a MOS semiconductor device having a localized anti-punchthrough region, and more particularly to a method of forming a MOS semiconductor device having a localized anti-punchthrough region which is not in contact with source/drain regions to reduce source/drain junction capacitance.

2. Technical Background

A conventional method for fabricating a MOS semiconductor device having an anti-punchthrough region is illustrated in FIGS. 1A–1C in cross-sectional views. Referring to FIG. 1A, P-type substrate 1 is first implanted with P-type impurities (e.g., Boron) to form anti-punchthrough region 10 beneath the surface of the substrate 1. Referring next to FIG. 1B, implanted P-type substrate 1 is then subjected to oxidation to form a gate oxide layer 12 thereon. Polysilicon layer 14 is deposited on oxide layer 12. It is noted that polysilicon layer 14 is typically doped with impurities to increase its conductivity. Polysilicon layer 14 and oxide layer 12 are thereafter patterned and etched to form a corresponding gate electrode 14 and a gate oxide layer 12.

Referring now to FIG. 1C, an ion implantation process is then conducted to implant N-type impurities, such as arsenic and phosphorus, into P-type substrate 1 to form N-type heavily-doped regions 16 which constitute source/drain regions. Gate electrode 14 is used as a mask in this process.

However, as shown in FIGS. 1A–1C, anti-punchthrough region 10 fabricated by the conventional method is not localized, but spreads over all the area beneath the gate region, and therefore is in contact with N-type heavily-doped regions 16. Accordingly, the junction capacitance of the source/drain regions of the resulting MOS device increases, and thus reducing device operational speed.

The anti-punchthrough region is originally formed for the purpose of narrowing the depletion region when the source/drain region is operated in reverse-biased condition so as to attain anti-punchthrough. However, as the anti-punchthrough region formed by conventional method becomes not localized, the junction capacitance of the source/drain regions is increased and the operational speed of the device is reduced.

For the foregoing reasons, there is a need to have a method of forming a MOS device having a localized anti-punchthrough region, with reduced source/drain junction capacitance for high speed submicron device applications.

SUMMARY OF THE INVENTION

It is therefore an object of the present invention to provide a method of forming a MOS device having a localized anti-punchthrough region, which is adjacent to but is not in contact with the source/drain regions.

It is another object of the present invention to provide a MOS device having a localized anti-punchthrough region.

The above objects of the invention are attained by providing a method utilizing a trench, which is formed by depositing a conducting layer on an oxide layer located on the channel region of a MOS device, as a self-alignment mask for a subsequent implantation process, to form a localized anti-punchthrough region.

Specifically, the method of the invention includes (a) providing a silicon substrate doped with impurities of a first conductivity type and having a predetermined channel region defined by a barrier layer; (b) forming an oxide layer on the channel region, and then forming a first conducting layer on the oxide layer and the barrier layer, to form a trench on the channel region; (c) applying ion implantation to implant ions of a first conductivity type through the trench into the substrate to form the localized anti-punchthrough region therein by using the first conducting layer as a mask; (d) forming a second conducting layer on the first conducting layer to fill up the trench; (e) removing the barrier layer to form a gate; and (f) applying ion implantation to implant ions of a second conductivity type into the substrate to form source/drain regions.

Other objects, features and advantages of the invention will become more apparent by way of the following detailed description of the preferred but non-limiting embodiment.

BRIEF DESCRIPTION OF THE DRAWINGS

The detailed description of the preferred embodiments of the invention is made with reference to the accompanying drawings, wherein.

DETAILED DESCRIPTION OF THE PREFERRED EMBODIMENTS

Referring to FIGS. 2A–2H, these drawings show the steps of forming a MOS transistor on P-type substrate 2 according to the present invention. The process steps of the preferred embodiments are now described below.

Figure 1A:
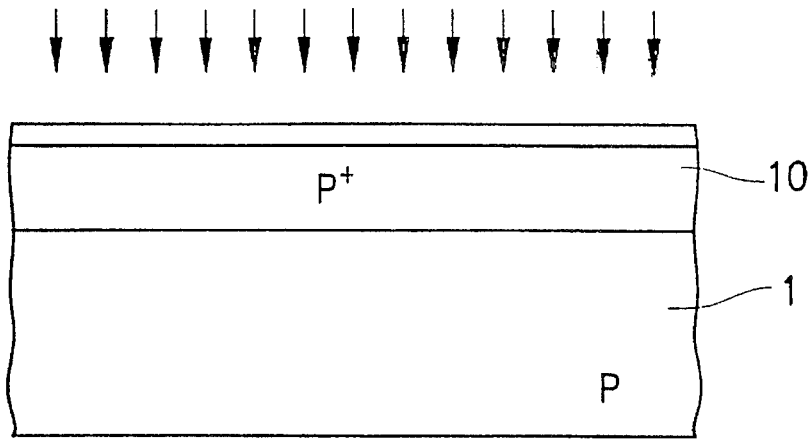
FIGS. 1A–1C show in cross-sectional views the conventional method of forming a MOS device having an anti-punchthrough region.
Figure 1B:
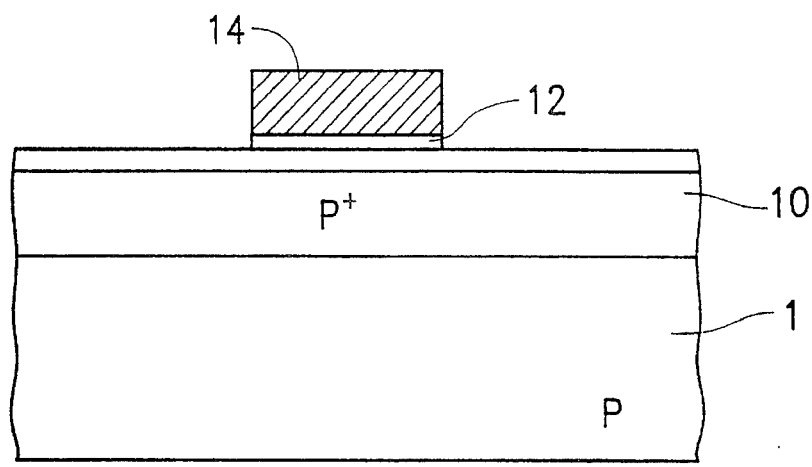
Figure 1C:
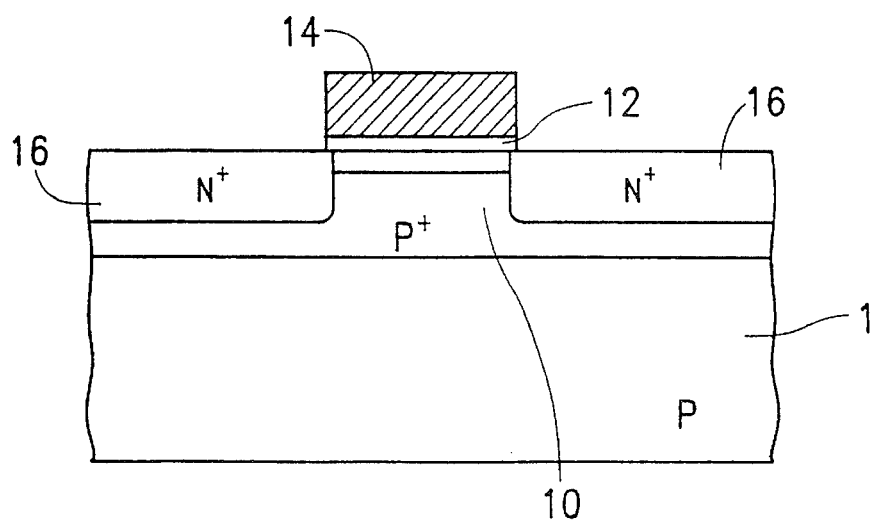
Figure 2A:
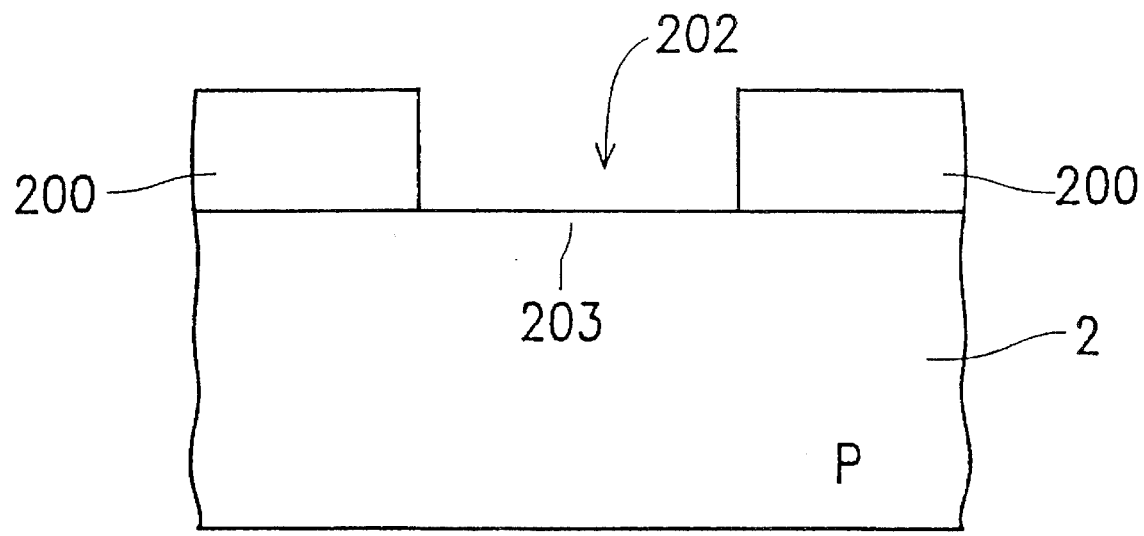
FIGS. 2A–2H show in cross-sectional views the method of forming a MOS device having a localized anti-punchthrough region in accordance with the preferred embodiments of the present invention.

Referring to FIG. 2A, barrier layer 200 (e.g., silicon nitride or silicon oxide) with a thickness of 2000–5000 Å is first deposited on P-type substrate 2, followed by removing a portion of barrier layer 200, which defines channel region 203, to form an opening 202.

Figure 2B:
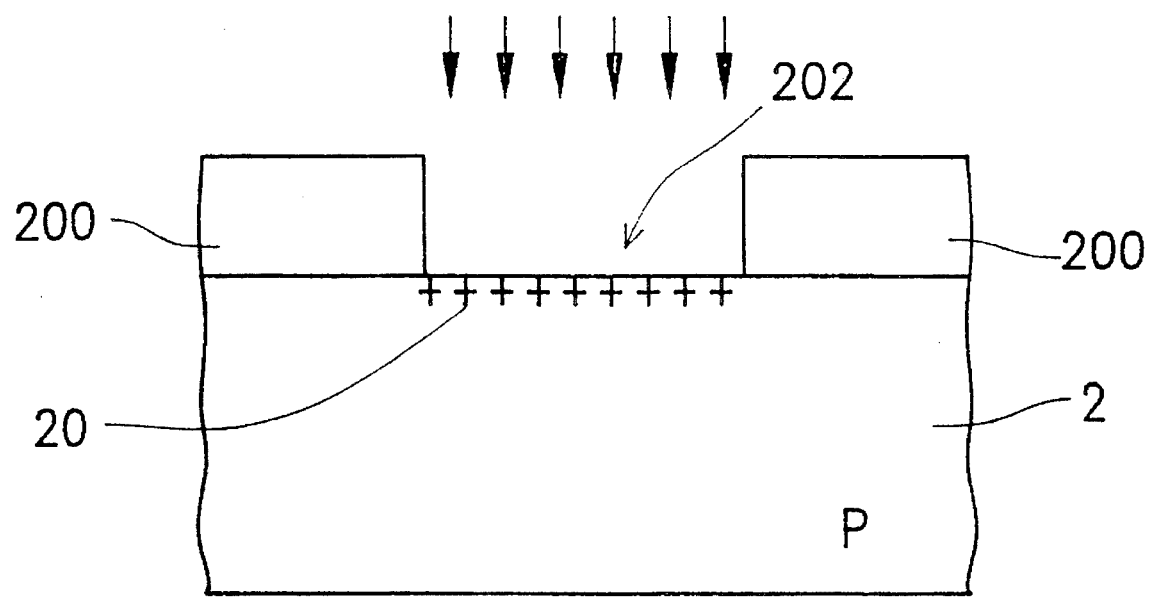

Referring now to FIG. 2B, P-type impurities (e.g., B or BF2) are then implanted into the P-type substrate 2 to form threshold voltage adjustment region 20. Threshold voltage adjustment region 20 is used to adjust the threshold voltage of a MOS transistor. The implanting dose for forming threshold voltage adjustment region 20 is about 5E11 atoms/cm2 and the implanting energy is 20 KeV-50 KeV.

Figure 2C:
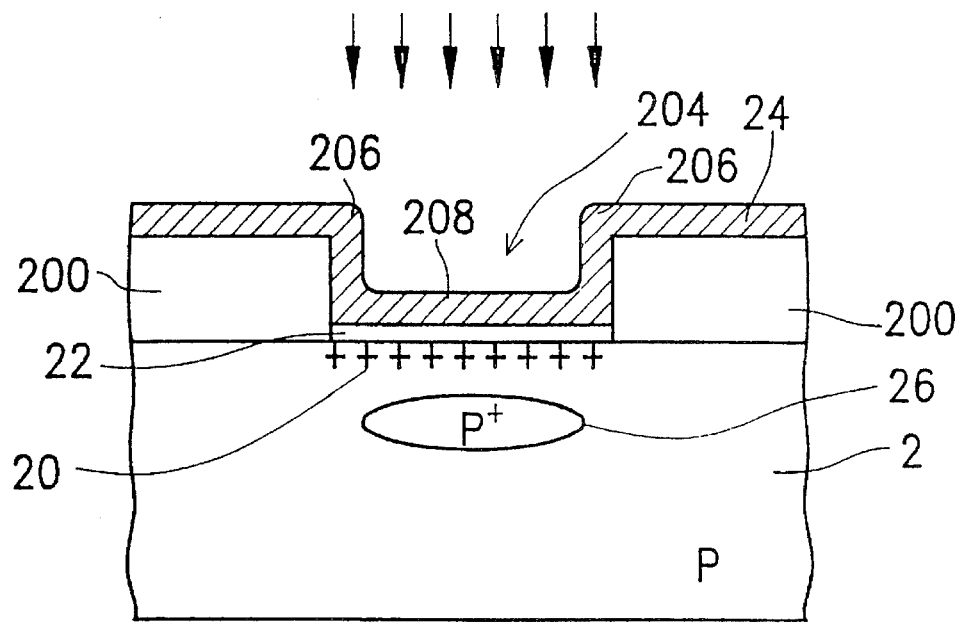

Referring next to FIG. 2C, the portion of P-type substrate 2 not covered by barrier layer 200 is subjected to oxidation to grow gate oxide layer 22 to a thickness of 100A–200A. After gate oxide layer 22 is formed, conducting layer 24 (e.g., impurity-doped polysilicon) having a thickness of 500A-2000 Å is deposited on barrier layer 200 and gate oxide layer 22. Note that because of the height difference between barrier layer 200 and gate oxide layer 22, conducting layer 24 is formed as trench 204. Thereafter, using conducting layer 24 as a mask, ion implantation is applied to implant ions of P-type through trench 204 into substrate 2 to form localized anti-punchthrough region 26. With side wall region 206 of trench 204 being higher than bottom region

208 thereof with respect to substrate 2, as long as a proper implanting energy is chosen, formed anti-punchthrough region 26 is localized, i.e., it does not spread over all the-area beneath the gate region. The implanting dose for forming anti-punchthrough region 26 is 2E11 atoms/cm2–2E12 atoms/cm2 and the implanting energy is 80 KeV–150 KeV.

Figure 2D:
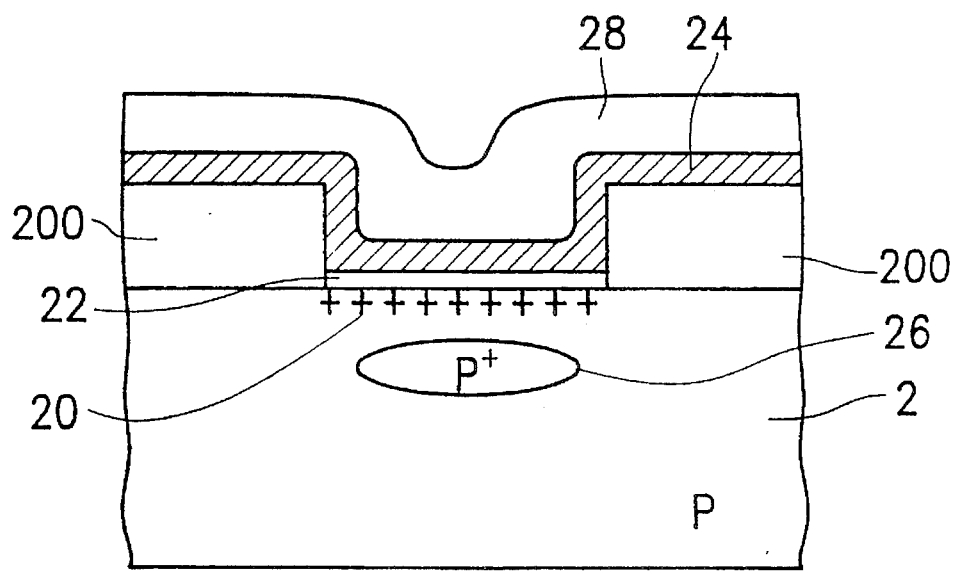

Referring to FIG. 2D, conducting layer 28 (e.g., a doped polysilicon, silicide or refractory metal) is then formed on the surface of conducting layer 24 to fill up trench 204.

Figure 2E:
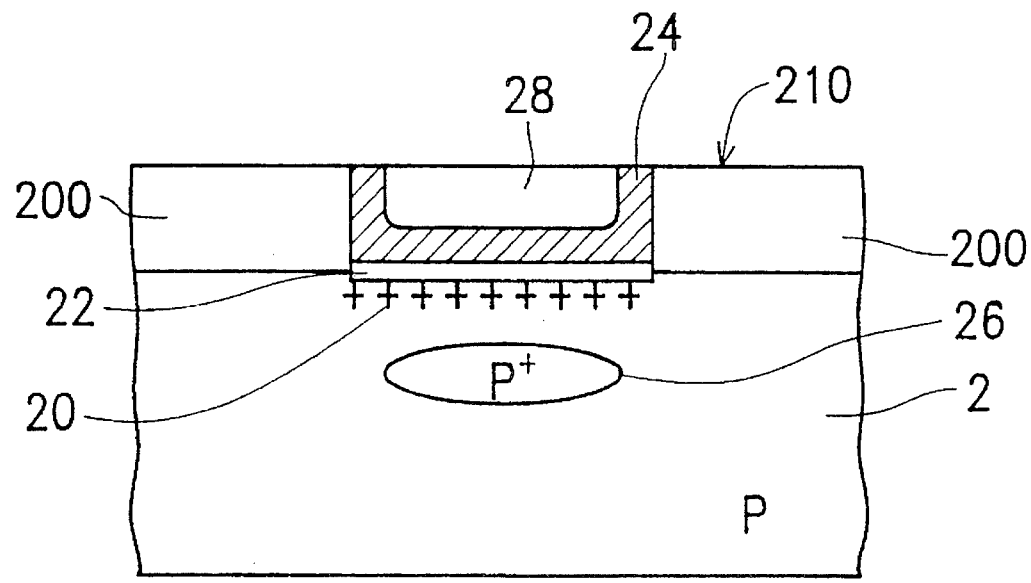

Referring to FIG. 2E, conducting layer 28 and conducting layer 24 are planarized to make the top surface of the two conducting layers 24 and 28 be in alignment with the top surface of barrier layer 200, as indicated by numeral 210. The planarization can be conducted by, for example, an etch-back process such as reactive ion etching or by chemical mechanical polishing (i.e, polishing by using a chemical solution and mechanical means at the same time).

Figure 2F:
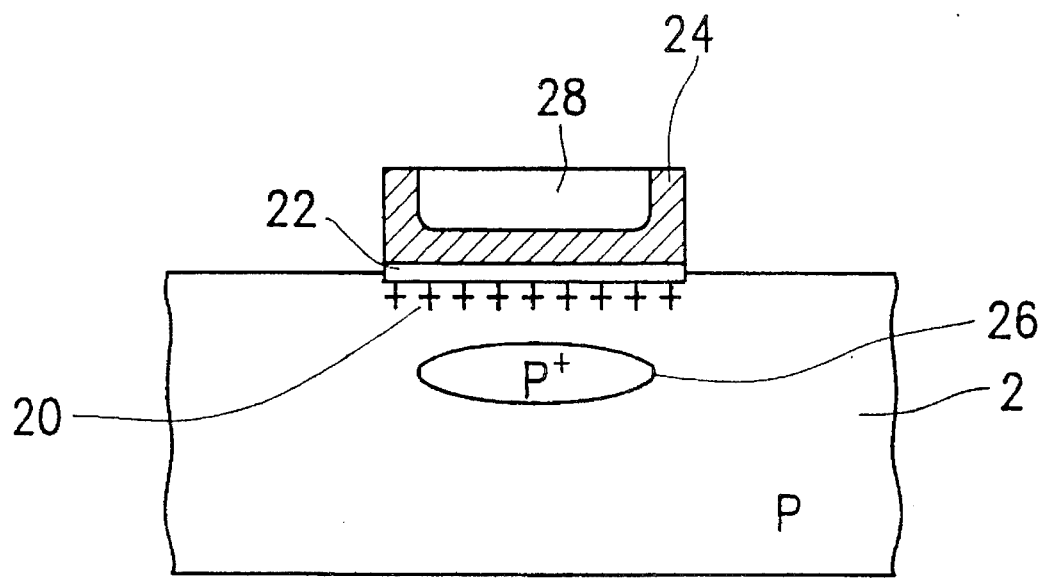

Barrier layer 200 is then removed (e.g., by reactive ion etching or wet etching), as indicated in FIG. 2F, and the conducting layer 28 and the polysilicon layer 24 are exposed to form the gate electrode of a MOS transistor.

Figure 2G:
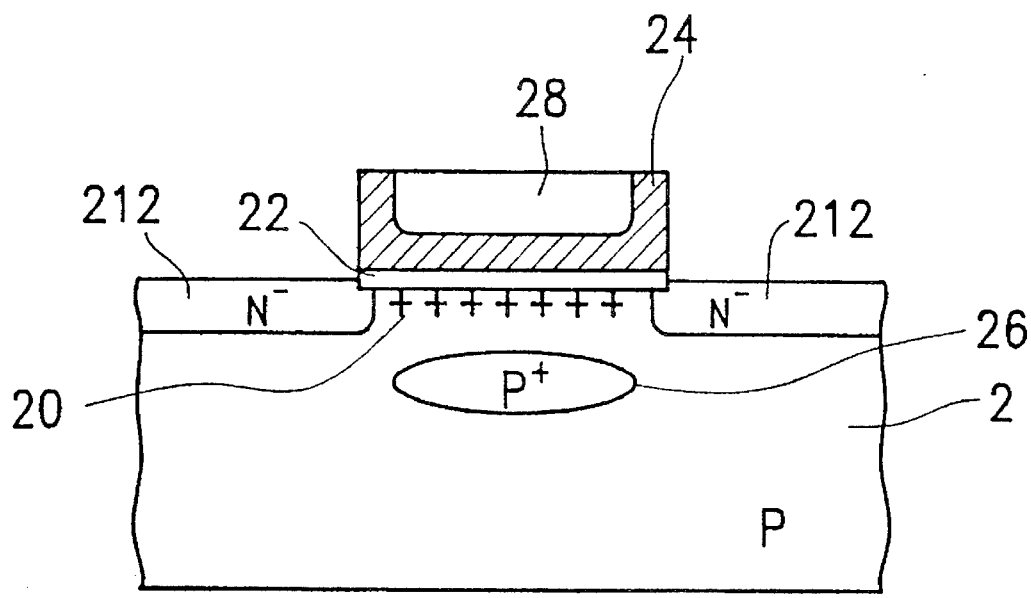

Referring to FIG. 2G, N-type impurities (e.g., P, As) are implanted into P-type substrate 2 to form N-type lightly-doped regions 212.

Figure 2H:
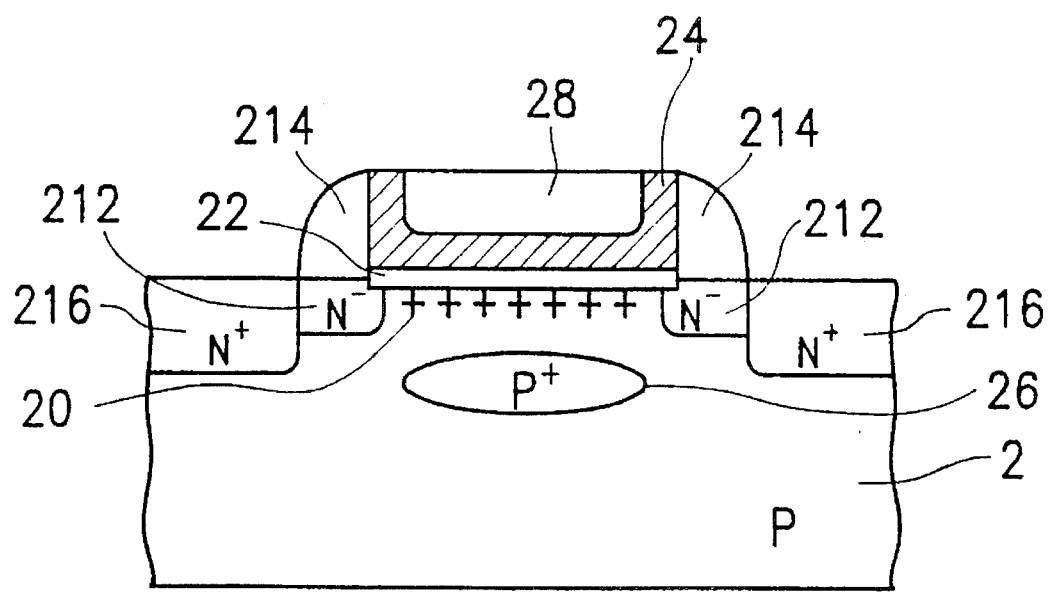

Finally turning to FIG. 2H, sidewall spacers 214 are formed on the sidewall of the gate electrode. Sidewall spacers 214 are used as a mask when subsequent N-type impurity implantation is applied. The N-type impurity implantation forms N-type heavily-doped regions 216. Spacers 214 are formed by first depositing oxide on the structure of FIG. 2G, followed by etching the oxide with plasma.

The above embodiment illustrates the steps for forming a LDD (lightly-doped drain) structure. The LDD structure can then be used to eliminate leakage current through the gate oxide induced by hot electron effects. However, if the step shown in FIG. 2H is ignored, and in the step shown in FIG. 2G, N-type impurities are implanted to form N-type heavily-doped regions, a conventional source/drain structure is formed.

The disclosed method employs self-alignment to form a MOS structure having a localized anti-punchthrough region which will decrease the junction capacitance of source/drain regions, thereby helping to increase the operational speed of the resulting MOS transistors.

What is claimed is:

1. A method of forming a MOS device having a localized anti-punchthrough region, comprising the steps of:

(a) providing a silicon substrate doped with impurities of a first conductivity type and having a predetermined channel region defined by a barrier layer;

(b) forming an oxide layer on said channel region, and then forming a first conducting layer on said oxide layer and said barrier layer, to form a trench on said channel region;

(c) applying ion implantation to implant ions of a first conductivity type through said trench into said substrate to form said localized anti-punchthrough region therein by using said first conducting layer as a mask;

(d) forming a second conducting layer on said first conducting layer to fill up said trench;

(e) removing said barrier layer to form a gate; and (f) applying ion implantation to implant ions of a second conductivity type into said substrate to form source/drain regions.

2. The method of claim 1, wherein step (e) further comprises: applying ion implantation to implant ions of a second conductivity type into said substrate to form lightly-doped regions therein; and forming spacers on the sidewall of said gate.

3. The method of claim 1, further comprising a step, between step (a) and step (b), of applying ion implantation to implant ions of a first conductivity into said substrate through said channel region.

4. The method of claim 1, further comprising a step, between step (d) and step (e), of planarizing said first conducting layer and said second conducting layer to be in alignment with the top surface of said barrier layer.

5. The method of claim 4 wherein said planarization step is carried out by chemical mechanical polishing.

6. The method of claim 1, wherein said barrier layer is silicon oxide.

7. The method of claim 1, wherein said barrier layer is silicon nitride.

8. The method of claim 1, wherein said first conducting layer is an impurity-doped polysilicon.

9. The method of claim 1, wherein said second conducting layer is polysilicon.

10. The method of claim 1, wherein said second conducting layer is silicide.

11. The method of claim 1, wherein said second conducting layer is a refractory metal.

12. The method of claim 1, wherein said first type is P-type and said second type is N-type.

13. The method of claim 1, wherein said first type is N-type and said second type is P-type.

* * * * *